US012658919B2

(12) United States Patent
Landenbach et al.

(10) Patent No.: US 12,658,919 B2
(45) Date of Patent: Jun. 16, 2026

(54) BI-DIRECTIONAL LEVEL SHIFTER

(71) Applicant: Infineon Technologies AG, Neubiberg (DE)

(72) Inventors: Richard Landenbach, Erzhausen (DE); Albrecht Mayer, Waakirchen (DE)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 18/581,518

(22) Filed: Feb. 20, 2024

(65) Prior Publication Data

US 2025/0266836 A1     Aug. 21, 2025

(51) Int. Cl.
H03K 19/0175     (2006.01)
H03K 19/0185     (2006.01)
H03K 19/20     (2006.01)

(52) U.S. Cl.
CPC ..... H03K 19/018521 (2013.01); H03K 19/20 (2013.01)

(58) Field of Classification Search
CPC ....... H03K 19/0175; H03K 19/017509; H03K 19/0185; H03K 19/018507; H03K 19/018521; H03K 19/20
See application file for complete search history.

(56) References Cited

U.S. PATENT DOCUMENTS

2005/0057296 A1*   3/2005   Dharne ............ H03K 3/356113
                                                                327/333

* cited by examiner

Primary Examiner — Long Nguyen
(74) Attorney, Agent, or Firm — Banner & Witcoff, Ltd.

(57)     ABSTRACT

A bi-directional level shifter is described that combines an input/output (I/O) signal and a direction control signal into a single signal, thereby reducing the number of total pins. The combination of I/O and direction is encoded by different voltage levels, and thus no information is encoded by currents. This advantageously keep power consumption low compared to conventional designs. Moreover, because a predetermined voltage encoding is used in which the bi-directional level shifter is configured to detect and respond via hardware, transitions between data flow are detected very quickly.

30 Claims, 5 Drawing Sheets

100

120

140

BI-DIRECTIONAL LEVEL SHIFTER

TECHNICAL FIELD

The disclosure generally relates to the use of bi-directional level shifters and, in particular, to a bi-directional level shifter that combines a data direction indicator with input/output (I/O) data to sense the direction of data flow and selectively perform level shifting based upon a voltage level encoding scheme.

BACKGROUND

Level shifters are often implemented to couple signals between digital circuits that operate within different ranges of logical voltage levels. For example, digital circuits may operate within complementary metal oxide semiconductor (CMOS) logical voltage levels that vary between an upper voltage level, typically referred to as VDD, and a lower voltage level, typically referred to as VSS. The values for VSS may comprise, for example, a reference voltage such as 0 volts, whereas the values for VDD may comprise, for example, 1.8V, 3.3V, 5V, etc. Moreover, bi-directional level shifters enable data communication between coupled digital circuits in both directions by performing level shifting that functions to translate the different ranges of logical voltage levels from one digital circuit to the operating range used by the other digital circuit. However, current implementations of bi-directional level shifters have various drawbacks.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The example aspects of the present disclosure will be described with reference to the accompanying drawings. The drawing in which an element first appears is typically indicated by the leftmost digit(s) in the corresponding reference number.

SUMMARY

Figure 1A:
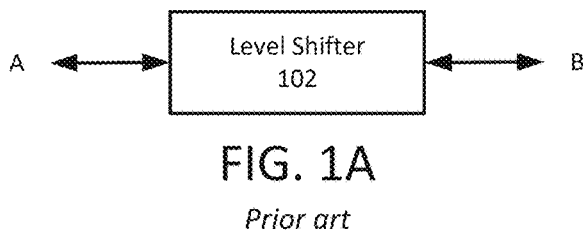
FIGS. 1A-1C illustrate the use of a conventional bi-directional level-shifters.

Again, conventional bi-directional level shifters have various drawbacks, particularly with respect to the need for dedicated pins to indicate the data direction between the coupled digital circuits and/or high power consumption. The embodiments as further discussed herein remedy these issues by utilizing a voltage encoding scheme that allows for the data direction to be detected via the voltages provided on one of the input/output (I/O) interfaces. For instance, a bi-directional level shifter as further discussed herein may include a number of I/O interfaces, each being coupled to a respective digital circuit that is configured to operate within a particular range of logical voltage levels VSS-VDD. As is typically the case for level-shifting applications, the range of logical voltage levels VSS-VDD differs between the two digital circuits. For instance, and as further discussed herein, one digital circuit may be configured to operate within a first range of logical voltage levels VSS1-VDD1 (e.g. 0V-3.3V), whereas the other digital circuit may be configured to operate within a second range of logical voltage levels VSS2-VDD2 (e.g. 0V-5V).

The digital circuits may represent any suitable type of device configured to transmit and receive data via a respective I/O interface, with the bi-directional level shifter supporting data communications between the different digital circuits in one direction at a time. Thus, the digital circuits may comprise microcontrollers, sensors, electronic control units (ECUs), actuators, electromechanical components, etc. As discussed in further detail below, one of the digital circuits functions to control the direction of data between the different digital circuits, and thus may be referred to herein as the "controlling" digital circuit. The controlling digital circuit may comprise a microcontroller, hardware, software, or combinations of these to facilitate the determination of a data direction between the controlling digital circuit and the other digital circuit that is coupled to the bi-directional level shifter. Therefore, each digital circuit is configured to transmit data (i.e. when operating in an output or transmitting mode) while the other digital circuit is configured to receive data (i.e. when operating in an input or receiving mode).

Once a determination with respect to data direction is made by the controlling digital circuit, the bi-directional level shifter that is coupled to the digital circuits facilitates level-shifting between the digital circuits in accordance with the determined data direction. To do so, and as further discussed below, the embodiments as discussed herein are directed to a bi-directional level shifter that selectively performs level shifting in a particular direction based upon a predetermined voltage level encoding scheme that is implemented by the controlling digital circuit and recognized by the bi-directional level shifter. For example, the bi-directional level shifter is configured to recognize that the controlling circuit is receiving data when the controlling circuit temporarily drives voltage levels on the I/O interface to within an intermediate range of voltage levels within a first range of logical voltage levels VSS1-VDD1 (e.g. between 5/6 and 1/6 of VDD1). Otherwise, when the controlling circuit drives the voltage levels on the I/O interface to outside this intermediate range of voltage levels (but still within the first range of logical voltage levels VSS1-VDD1), the bi-directional level shifter is configured to recognize that the controlling digital circuit is operating in a transmitting mode of operation. The bi-directional level shifter is thus configured to perform level shifting in one of two different directions based upon the detection of the operating mode of the coupled digital circuits by way of the voltage levels provided on the I/O interface via the controlling digital circuit.

Advantageously, regardless of the direction of data flow, no current flow (or a negligible current flow) is required to detect transitions between the different directions as well as to maintain the data flow in a particular direction once detected. Moreover, because a predetermined voltage encoding is used in which the bi-directional level shifter is configured to detect and respond via a hardware configuration, such transitions are detected very quickly and without the need for additional, dedicated direction flow pins.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

The embodiments described herein may be implemented in accordance with any suitable communication architecture that leverages bi-directional level shifting between any suitable number of coupled digital circuits. The I/O interfaces between the bi-directional level shifter and the coupled digital circuits may comprise a single wire. However, this is by way of example and not limitation, and the embodiments as described herein may alternatively use any suitable number of wires as part of the respective I/O interfaces. Moreover, for ease of explanation, specific examples are shown herein with respect to the different ranges of logical voltage levels VSS-VDD, such as 0-3.3V and 0-5V. These ranges of logical voltage levels are provided by way of example and not limitation, and the embodiments described herein may implement any suitable ranges of logical voltage levels, intermediate voltage levels, and/or threshold trigger voltages used by the bi-directional level shifter to detect the data direction as further discussed herein. Additionally, although the controlling circuit is discussed herein as operating within a range of logical voltage levels that are less than those used by the other digital circuit, this is also by way of example and not limitation. The embodiments discussed herein also comprise the controlling circuit having a larger range of logical voltage levels than the other digital circuit.

Figure 1B:
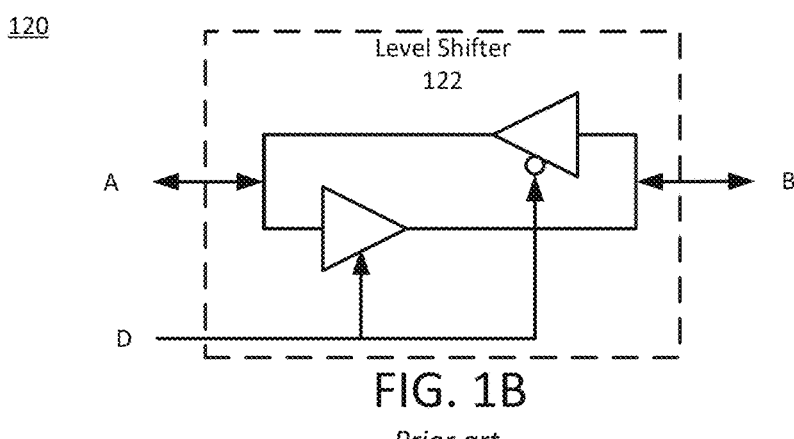
Figure 1C:
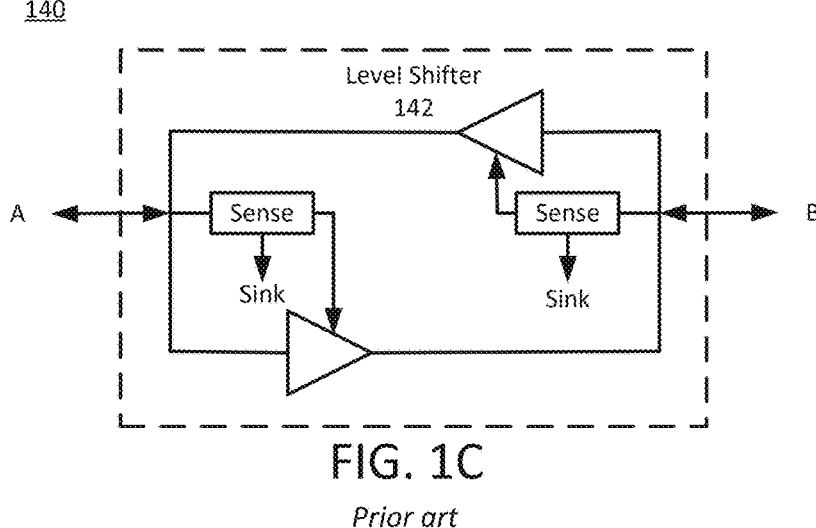

FIGS. 1A-1C illustrate the use of conventional bi-directional level-shifters, which comprise implementations that are widely used to perform bi-directional signaling. Each of the bi-directional level shifters 102, 122, 142 is coupled to respective digital circuits A and B via I/O interfaces as represented via the double-sided arrows. The bi-directional level shifter 102 of FIG. 1A illustrates a general conventional bi-directional level shifter system in which the digital circuits A and B operate within two different ranges of logical voltage levels VSS-VDD, as noted above. For instance, digital circuit A may operate within 0V-1.8V, whereas digital circuit B may operate within 0V-5V.

The bi-directional level shifter 122 of FIG. 1B uses an external direction select pin (D) to control the direction of the two bi-directional signals (A, B). Although none of the signals draws significant current, this requires the use of a third dedicated pin (D) for data direction, which adds cost and requires additional space.

The bi-directional level shifter 142 of FIG. 1C uses auto-sensing to overcome the need for a dedicated direction pin. However, at least one signal (A or B) draws a small current to detect if an output (current source) or an input (high Z) is connected. Thus, the auto-sensing configuration as shown in FIG. 1C requires a high power consumption and also leads to added design and operating expenses.

To remedy such issues, the embodiments as discussed herein combine the I/O signal (A) and direction control signal (D) of the bi-directional level shifter 122 into a single signal, thereby reducing the number of total pins. Moreover, as the combination of I/O and direction is encoded by different voltage levels, no information is encoded by currents. This advantageously keeps power consumption low compared to conventional designs.

Figure 2A:
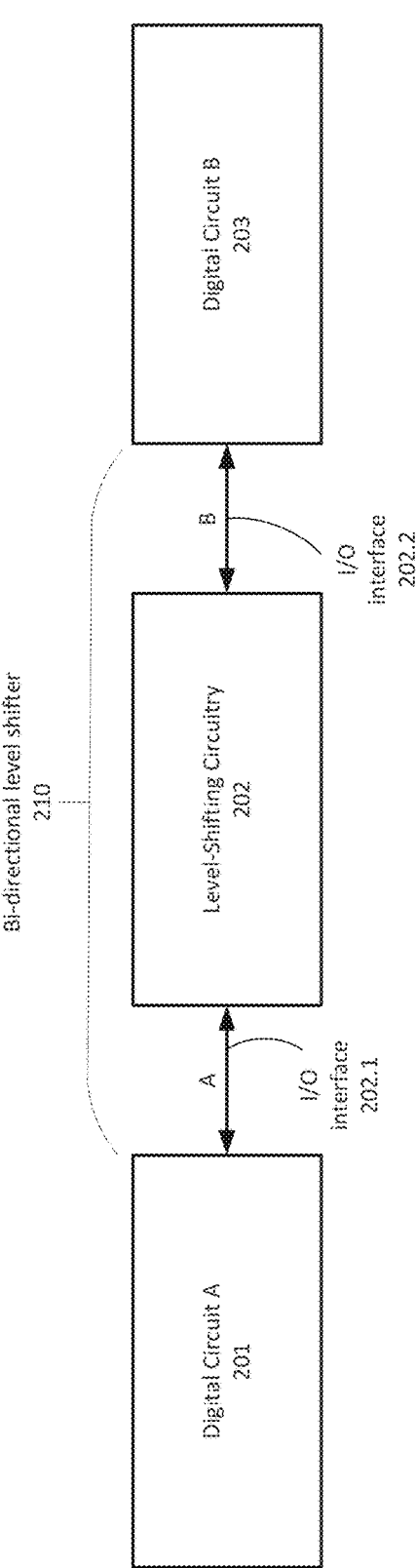
FIG. 2A illustrates an example bi-directional level shifting system, in accordance with one or more embodiments of the disclosure.

FIG. 2A illustrates an example bi-directional level shifting system, in accordance with one or more embodiments of the disclosure. The bi-directional level shifting system 200 as shown in FIG. 2A comprises a bi-directional level-shifter 210, which in turn comprises level-shifting circuitry 202 and I/O interfaces 202.1, 202.2. Each of the I/O interfaces 202.1, 202.2 may comprise any suitable number and/or type of terminals, traces, pins, buses, wires, etc., which are configured to be coupled to the digital circuits 201 (digital circuit A) and 203 (digital circuit B). Thus, the level-shifting circuitry 202 is coupled to the I/O interface 202.1 and the I/O interface 202.2, which are in turn coupled to the digital circuits 201, 203, respectively, as shown in FIG. 2A.

As noted above, each of the digital circuits 201, 203 is configured to selectively operate in a transmitting (i.e. output) mode or a receiving (i.e. input) mode. In each case, each of the digital circuits 201, 203 are configured to transmit or receive data signals that comply with (e.g. are within the voltage ranges defined by) logical voltage levels used by the digital circuits 201, 203, as the case may be. As noted above, the digital circuits 201, 203 may comprise any suitable type of digital circuit that may form part of and/or communicate within a larger overall system. Thus, and as noted above, each of the digital circuits 201, 203 may respectively comprise, for instance, a microcontroller, a sensor, an ECU, an actuator, an electromechanical component, etc. To provide additional examples, each of the digital circuits 201, 203 may respectively comprise additional components not shown in the Figures.

As discussed in further detail below, one of the digital circuits 201, 203 may be implemented as a controlling digital circuit, which functions to control the direction of data between the digital circuits 201, 203. In the example used in further detail herein, the digital circuit 201 functions as the controlling circuit. Thus, and as shown in FIG. 2C, the digital circuit 201 comprises processing circuitry 201.4, which may comprise any suitable number and/or type of dedicated hardware components such as one or more processors, an application specific integrated circuit (ASIC), a field programmable gate array (FPGA), a system on a chip (SoC), dedicated logic and/or other circuitry, etc. The processing circuitry 201.4 may be implemented as one or more processors and/or cores, which may execute computer-readable instructions to perform any of the various functions as discussed in further detail herein with respect to controlling the overall operation of the digital circuit 201. The mode control module 201.5 may comprise any suitable type of non-transitory computer readable medium such as volatile memory, non-volatile memory, or combinations of these. To the extent that the digital circuit 201 implements software-based solutions to perform the various functions as discussed herein, this may be achieved, for instance, via the processor circuitry 201.4 executing instructions stored in the mode control module 201.5.

Referring back now to FIG. 2A, the digital circuit 201 is configured to operate within a first range of logical voltage levels, whereas the digital circuit 203 is configured to operate within a second, different range of logical voltage levels. To do so, the digital circuits 201, 203 may implement respective dies, for example, with each different die being configured to operate in accordance with a range of logical voltage levels (e.g. between respective "rail" voltages). The embodiments as described herein use examples of the first range of logical voltage levels being between 0V and 3.3V and the second range of logical voltage levels being between 0V and 5V. However, and as noted above, this is by way of example and not limitation, as the digital circuits 201, 203 may operate in accordance with any suitable range of logical voltage levels that differ from one another.

The level-shifting circuitry 202 thus facilitates the bi-directional communication of data signals between the digital circuits 201, 203 via a selective level shifting process. To do so, the level-shifting circuitry 202 is configured to selectively perform level shifting based upon the direction of the data signals, i.e. the recipient of the signals A, B. The signals A, B as shown in FIG. 2A thus comprise bi-directional data signals that comply with the different ranges of logical voltage levels of each digital circuit 201, 203.

For instance, the signals A may comprise data signals that are transmitted by the digital circuit 201 to the digital circuit 203. As part of this process, the level-shifting circuitry 202 level-shifts the data signals A to generate the level-shifted data signals B, which are then received by the digital circuit 203. Thus, the data signals A are transmitted by the digital circuit 201 within the first range of logical voltage levels and, upon being level-shifted by the level-shifting circuitry 202, form the data signals B that comply with (e.g. have voltage values that are within) the second range of logical voltage levels used by the digital circuit 203.

As another example, the signals B may comprise data signals that are transmitted by the digital circuit 203 to the digital circuit 201. In this scenario, the level-shifting circuitry 202 level-shifts the data signals to generate the level-shifted data signals A, which are then received by the digital circuit 201. Thus, in this case the data signals B are transmitted by the digital circuit 203 within the second range of logical voltage levels and, upon being level-shifted by the level-shifting circuitry 202, form the data signals A that comply with (e.g. have voltage values that are within) the first range of logical voltage levels used by the digital circuit 201.

Figure 3:
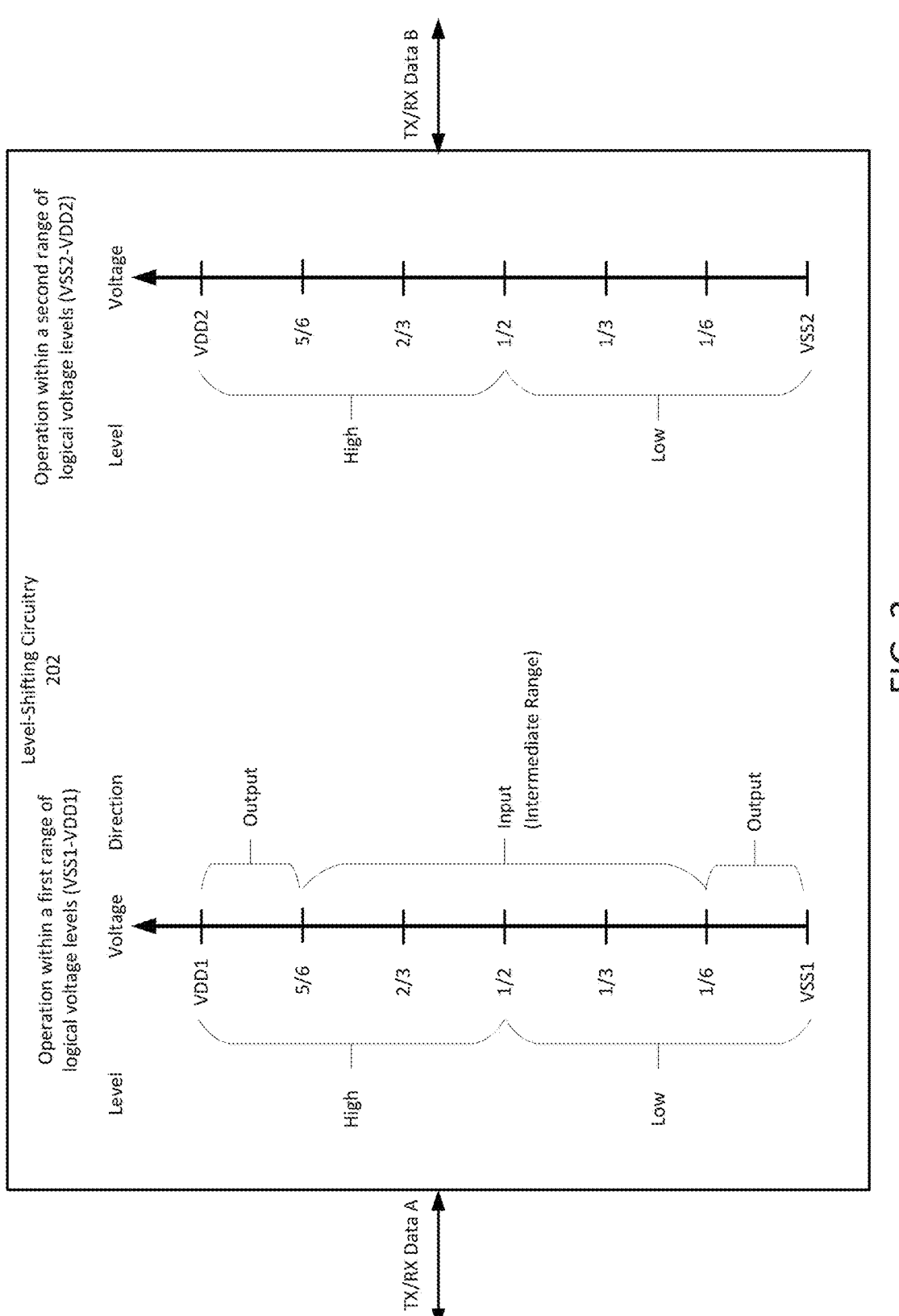
FIG. 3 illustrates an example voltage level encoding scheme for combining a data direction indicator with input/output (I/O) data, in accordance with one or more embodiments of the disclosure.

The level-shifting circuitry 202 is configured to selectively perform level-shifting in this manner based upon predetermined conditions being met with respect to the encoded voltage values provided by the digital circuit 201, as the digital circuit 201 functions as the controlling digital circuit in this example. An example of these encoded voltage values are shown in FIG. 3 and discussed in further detail below. For example, and with continued reference to FIG. 3, an intermediate range of voltage levels is defined within the first range of logical voltage levels VSS1-VDD1 used by the digital circuit 201. The intermediate range of voltage levels may comprise any suitable range that lies within the first range of logical voltage levels VSS1-VDD1 and need not be centered about one-half of VDD1 as shown in FIG. 3. For the example shown in FIG. 3, the intermediate range of voltage levels is defined as between $\frac{1}{6}$ and $\frac{5}{6}$ of the upper voltage level VDD1. Thus, embodiments include the intermediate range of voltage levels being defined by an upper voltage level (e.g. $\frac{5}{6}$ VDD1) that is less than the logical high voltage level (VDD1) (e.g. the maximum or upper rail voltage) of the first range of logical voltage levels (e.g. VSS1-VDD1) by an offset voltage (e.g. $\frac{1}{6}$ VDD1). The offset voltage that is a proportional to the logical high voltage level, with the proportion of $\frac{1}{6}$ being used herein as a non-limiting and illustrative example. Furthermore, the intermediate range of voltage levels may also be defined by a lower voltage level (e.g. $\frac{1}{6}$ VDD1) that is greater than a logical low value (VSS) (e.g. the minimum of lower rail voltage) of the first range of logical voltage levels by the offset voltage as noted above (e.g. $\frac{1}{6}$ of VDD1). Again, the range of intermediate values may be defined as any suitable voltage values within the first range of logical voltage levels VSS1-VDD1 used by the digital circuit 201, with the range as shown in FIG. 3 being a non-limiting and illustrative example.

In an embodiment, by defining the predetermined range of intermediate values, an encoding scheme may thus be implemented to enable the level-shifting circuitry 202 to detect the direction of data flow based upon the signals provided to the I/O interface 202.1 by the digital circuit 201. For example, the level-shifting circuitry 202 is configured to detect that the digital circuit 201 is transmitting data signals to the digital circuit 203 when the digital circuit 201 provides signals to the I/O interface 202.1 that are outside of the defined intermediate range of voltage levels as shown in FIG. 3. That is, when transmitting, the digital circuit 201 drives the state of the I/O interface 202.1 between VDD1 and $\frac{5}{6}$ of VDD1 to represent a logical high value, and drives the state of the I/O interface 202.1 between VSS1 and $\frac{1}{6}$ of VDD1 to represent a logical low value. In response, the level-shifting circuitry 202 is configured to provide level-shifted voltage levels on the I/O interface 202.2 that comply with the upper and lower digital voltage levels VDD2 and VSS2, respectively.

For example, in response to the digital circuit 201 providing a voltage on the I/O interface 202.1 that is between VDD1 and $\frac{5}{6}$ of VDD1, the level-shifting circuitry 202 is configured to output to the I/O interface 202.2 a logical high value that is between VDD2/2 and VDD2. Again, this complies with the second range of logical voltage levels as shown in FIG. 3 that are used by the digital circuit 203. Furthermore, in response the digital circuit 201 providing a voltage on the I/O interface 202.1 that is between VSS1 and $\frac{1}{6}$ of VDD1, the level-shifting circuitry 202 is configured to output to the I/O interface 202.2 a logical low value that is between VDD2/2 and VSS2. This also complies with the second range of logical voltage levels as shown in FIG. 3 that are used by the digital circuit 203. Of course, it is preferred for the level-shifting circuitry 202 to perform level shifting to drive the I/O interface 202.2 to voltage levels that are closer to the upper and lower ranges of the digital voltage levels VDD2 and VSS2 (instead of the mid-point of VDD2) to prevent a logical misinterpretation by the digital circuit 203.

Moreover, when the digital circuit 201 is receiving, the level-shifting circuitry 202 is configured to detect that a voltage level of signals provided by the digital circuit 201 are within the intermediate range of voltage levels, which again are within and span a smaller range than the first range of logical voltage levels VSS1-VDD1. It is noted that in this case, although the digital circuit 201 is in receiving mode, the digital circuit 201 may signal a transition from transmitting to receiving by temporarily driving the I/O interface 202.1 to a voltage level within the intermediate range of voltage levels. In an embodiment, this may include the digital circuit 201 temporarily driving the I/O interface 202.1 to a voltage level that is one-half of VDD1. Although this is by way of example, the use of the midpoint of the VDD1 logical voltage level may be particularly useful to ensure that the receive mode transition is recognized even in the presence of noise of other extraneous factors that may shift the voltage provided on the I/O interface 202.1.

Therefore, when the digital circuit 201 is receiving, the level-shifting circuitry 202 is configured to receive, via the I/O interface 202.2, data from the digital circuit 203 representing a logical high value that is between VDD2 and VDD2/2, as shown in FIG. 3. The level-shifting circuitry 202 in this scenario is configured to output to the I/O interface 202.1 a logical high value that is between 5/6 of VDD1 and VDD1/2, as shown in FIG. 3, which complies with the first range of logical voltage levels used by the digital circuit 201. Furthermore, in response to receiving a logical low value via the I/O interface 202.2 that is between VSS2 and VDD2/2, the level-shifting circuitry 202 is configured to output to the I/O interface 202.1 a logical low value that is between 1/6 of VDD1 and VDD1/2, as this also complies with the first range of logical voltage levels used by the digital circuit 201. It may be particularly advantageous for the level-shifting circuitry 202 to utilize the midpoint ranges within the intermediate range of voltage levels for this purpose (i.e. 1/6 to 5/6 of VDD1) to ensure that the digital circuit 201 recognizes the low and high digital values encoded in this manner. Thus, the level-shifting circuitry 202 may output level-shifted signals A having a logical high value of 2/3 VDD1 and a logical low value of 1/3 VDD1, which are still recognized within the first range of logical voltage levels by the digital circuit 201 as a logical high and a logical low value, respectively.

In this way, the level-shifting circuitry 202 is configured to selectively operate in two different modes and to selectively switch between each mode based upon the voltage level of the signals provided by the digital circuit 201. For instance, the level-shifting circuitry 202 is configured to receive, via the I/O interface 202.1, signals provided by the digital circuit 201 and to transmit level-shifted signals to the digital circuit 203 via the I/O interface 202.2 based upon the voltage level of the signals provided by the digital circuit 201, as noted above. Moreover, the level-shifting circuitry 202 is configured to, based upon a change in the voltage level of the signals provided by the digital circuit 201, selectively switch to receiving, via the I/O interface 202.2 signals provided by the digital circuit 203 and to transmit, via the I/O interface 202.1, level shifted signals to the digital circuit 201.

Figure 2B:
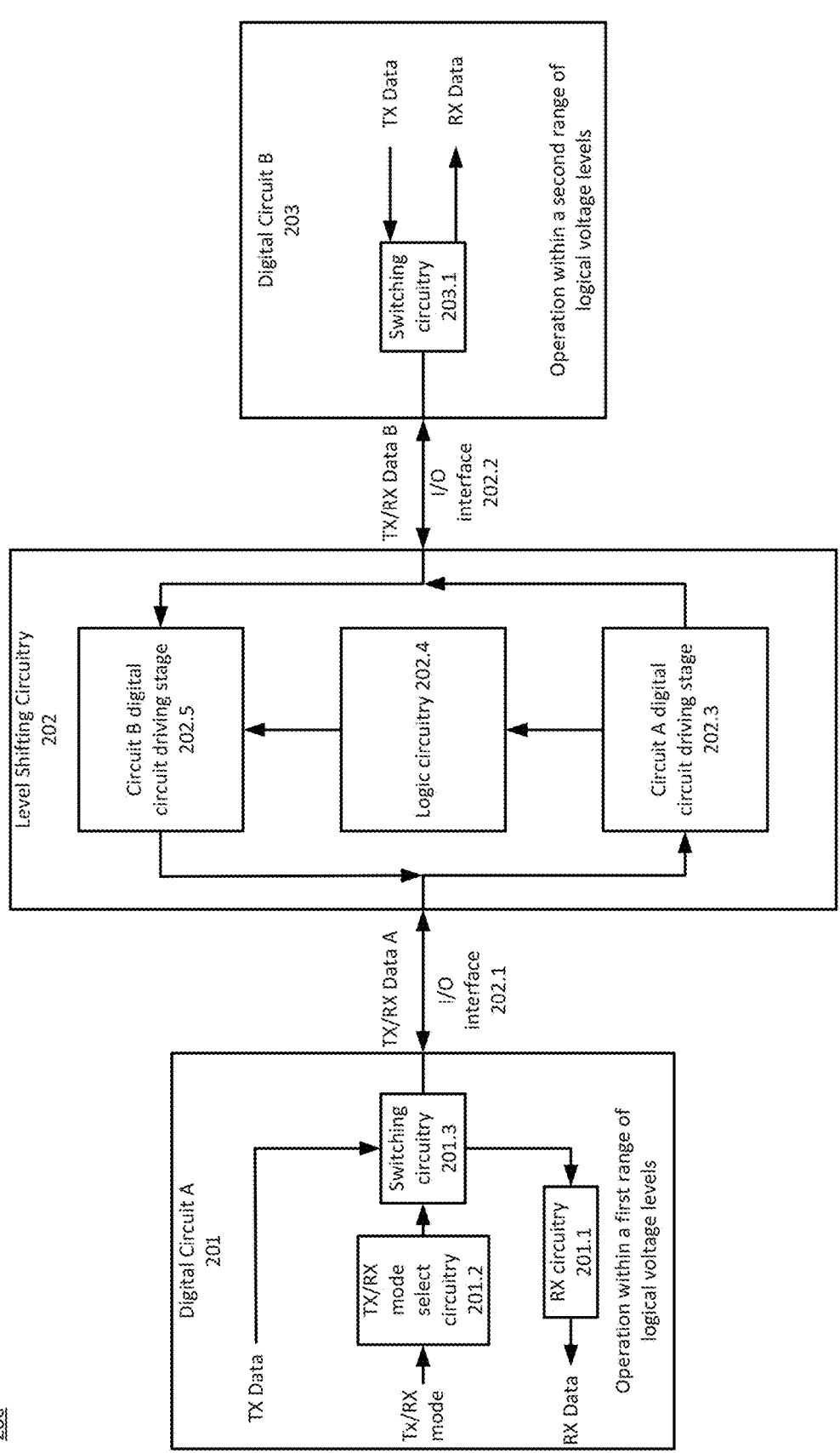
FIG. 2B illustrates an example of the bi-directional level shifting system as shown in FIG. 2A in further detail, in accordance with one or more embodiments of the disclosure.
Figure 2C:
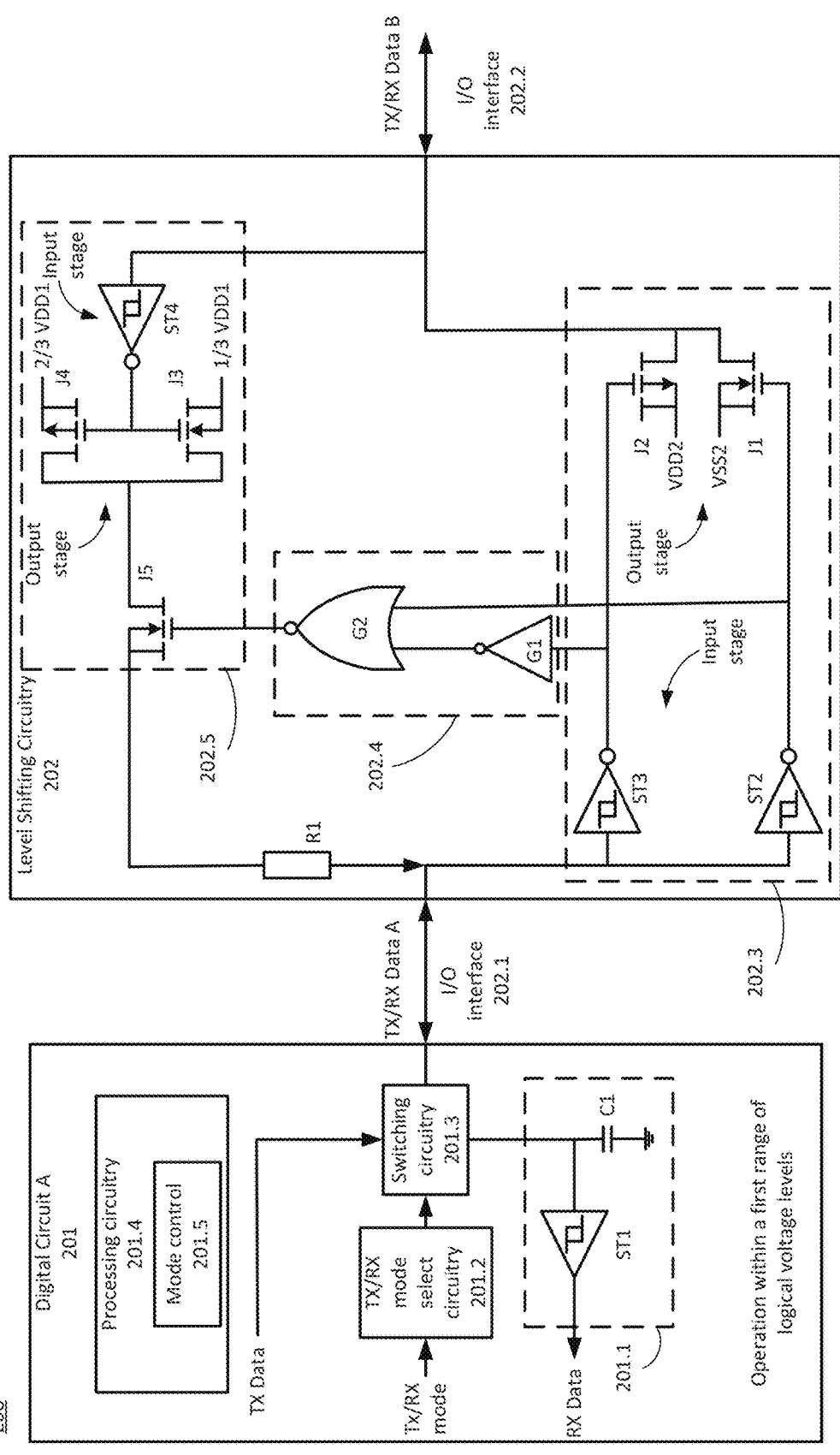
FIG. 2C illustrates an example of the bi-directional level shifting system as shown in FIG. 2A in even further detail, in accordance with one or more embodiments of the disclosure.

FIG. 2B illustrates an example of the bi-directional level shifting system as shown in FIG. 2A in further detail, in accordance with one or more embodiments of the disclosure. As shown in FIG. 2B, the digital circuit 201 comprises RX circuitry 201.1, TX/RX mode select circuitry 201.2, and switching circuitry 201.3.

The RX circuitry 201.1 may comprise any suitable combination of hardware components configured to detect the level shifted signals provided to the I/O interface 202.1 as a logical low or a logical high value in accordance with the first range of logical voltage levels. The RX circuitry 201.1 may comprise other components such as one or more filtering components, e.g. the capacitor C1 as shown in FIG. 2C, which may function to filter noise present on the I/O interface 202.1. In an embodiment, the RX circuitry 201.1 may comprise a buffer or a comparator circuit, such as the Schmitt trigger ST1 as shown in further detail in FIG. 2C. The RX circuitry 201.1 is thus configured to compare the voltage level of signals provided on the I/O interface 202.1 with a predetermined threshold value, which may be a proportion (e.g. half) of the logical high voltage level (VDD1) as shown in FIG. 3.

Thus, signals A having a voltage level (e.g. 2/3 VDD1) exceeding the predetermined threshold value (e.g. VDD1/2), result in the RX circuitry 201.1 providing an output signal (RX data) to the digital circuit 201 that is equivalent to the logical high value for the first range of logical voltage levels (e.g. VDD1). However, signals having a voltage level (e.g. 1/3 VDD1) that are less than the predetermined threshold value (e.g. VDD1/2) result in the RX circuitry 201.1 providing an output signal (RX data) to the digital circuit 201 that is equivalent to the logical low value for the first range of logical voltage levels (e.g. VSS1). When implemented as a Schmitt trigger, the RX circuitry 201.1 may be configured with two different threshold trigger values such that the level-shifted voltage levels provided on the I/O interface 202.1 are converted to corresponding voltage values in accordance with the first range of logical voltage levels.

The predetermined threshold trigger values may be selected in accordance with any range within the intermediate range of voltage levels to enable this functionality, with the RX circuitry 201.1 retaining its current value for signals having voltage values between these selected two threshold trigger values. For instance, the threshold trigger values for ST1 may be centered about 1/2 VDD1 and represent a narrower range of voltage values than those received via the I/O interface 202.1 As an illustrative example, the lower threshold and upper threshold values may be centered about 1/2 of VDD1, with a difference between one another (i.e. the narrower range noted above) being, for instance, +2%, +5%, +10%, etc.

In an embodiment, the switching circuitry 201.3 is configured to selectively couple the I/O interface 202.1 to either the TX data terminal of the digital circuit 201, to the RX circuitry 201.1, or to the TX/RX mode select circuitry 201.2 based upon the operating mode of the digital circuit 201. Thus, the switching circuitry 201.3 may comprise any suitable configuration of switching elements, which may be electronically-controlled switches such as transistors, solid-state actuators, electronically-controlled switches, etc. The switching circuitry 201.3 may have any suitable configuration of poles and throws such that any combination of the TX data terminal, the RX circuitry 201.1, and/or the TX/RX mode select circuitry 201.2 are coupled to the I/O interface 202.1 at a particular time.

For instance, when the digital circuit 201 is transmitting data on the I/O interface 202.1, the switching circuitry 201.3 is configured to couple the TX terminal (TX data) to the I/O interface 202.1. Moreover, when the digital circuit 201 is receiving data on the I/O interface 202.1, the switching circuitry 201.3 is configured to couple the RX circuitry 201.1 to the I/O interface 202.1. Furthermore, when the digital circuit 201 is transitioning to the transmit mode from another mode, the switching circuitry 201.3 is configured to couple the TX/RX mode select circuitry 201.2 to the I/O interface 202.1 at least temporarily as further discussed below. It is also noted that the switching circuitry 201.3 need not maintain continuous isolation between the TX data terminal, the RX circuitry 201.1, and/or the TX/RX mode select circuitry 201.2. For instance, the TX terminal and the RX circuitry 201.1 may be coupled to one another and to the I/O interface 202.1, with the digital circuit 201 then ignoring data received on the TX terminal (which may be placed into a high-impedance state) during the receiving mode, and vice-versa. Continuing this example, the switching circuitry 201.3 may then control only the selective coupling of the TX/RX mode select circuitry 201.2 based upon the current operation of the digital circuit 201.

To do so, embodiments include the TX/RX mode select circuitry 201.2 comprising any suitable number and/or type of driver components that are configured to temporarily drive the I/O interface 202.1 to a predetermined voltage level that is detected by the level-shifting circuitry 202. For example, the TX/RX mode select circuitry 201.2 may comprise any suitable combination of logic gates, pulse generators, timer-based hardware, etc., that is configured to temporarily drive the I/O interface 202.1 to a voltage level that is within the intermediate range of voltage levels when the digital circuit is transitioning from the output mode to the input mode.

To provide an illustrative example, the TX/RX mode select circuitry 201.2 may be configured to temporarily drive the voltage on the I/O interface 202.1 to one half of VDD1 to indicate that the digital circuit 201 is to begin receiving data on the I/O interface 202.1. The duration of this driving state (i.e. a temporary pulse) may be any suitable time period depending upon the configuration of the level-shifting circuitry 202. However, it may be particularly advantageous in the interest of providing power savings to generate this pulse with a relatively short duration. To provide some illustrative examples, for typical microcontrollers, the pulse length may be in the range of a several nanoseconds or on the order of tens or hundreds of nanoseconds.

Thus, and to provide an illustrative example for case of explanation, the digital circuit 201 may initially operate in a transmit mode by driving (via the TX terminal) the I/O interface 202.1 to provide voltage values that are outside the intermediate range of voltage levels as shown in FIG. 3. This may include, for example, voltage levels identified with the "output" voltage ranges within the first range of logical voltage levels VSS1-VDD1 as shown in FIG. 3, which results in the level-shifting circuitry 202 detecting the flow of data from the digital circuit 201 to the digital circuit 203, and performs level shifting accordingly.

Then, when the digital circuit 201 transitions to the receiving mode, the TX/RX mode select circuitry 201.2 temporarily drives the voltage of the I/O interface 201.1 to provide a voltage value that is within the intermediate range of voltage levels as shown in FIG. 3 (e.g. ½ of VDD1). In this state, the TX terminal stops actively driving the I/O interface 201.1 and is placed into a high-impedance state. Thus, the level-shifting circuitry 202 detects, in response to the voltage provided on the I/O interface 202.1, that the direction of data flow has now reversed and is now from the digital circuit 203 to the digital circuit 201, and performs level shifting accordingly. Additional details regarding this transition period and the ability of the level-shifting circuitry 202 to detect the data flow direction are further discussed below.

To detect and perform level shifting in the correct direction between the digital circuits 201, 203, the level-shifting circuitry 202 comprises digital circuit driving stages 202.3, 202.5 as well as logic circuitry 202.4. Each of the digital circuit driving stages 202.3, 202.5 is configured to perform level-shifting in a specific direction when receiving data from the digital circuit 201 and the digital circuit 203, respectively. Thus, the digital circuit driving stages 202.3, 202.5 correspond to level shifting that is performed with respect to receiving signals from each of the digital circuits 201, 203, respectively. To perform level-shifting in this manner, each of the digital circuit driving stages 202.3, 202.5 is coupled to the I/O interfaces 202.1, 202.2, as shown in FIG. 2B.

In an embodiment, the digital circuit driving stage 202.3 is configured to selectively level-shift signals provided by the digital circuit 201 from the first range of logical voltage levels VSS1-VDD1 to comply with the second range of logical voltage levels VSS2-VDD2. Likewise, the digital circuit driving stage 202.5 is configured to selectively level-shift signals provided by the digital circuit 203 from the second range of logical voltage levels VSS2-VDD2 to comply with the first range of logical voltage levels VSS1-VDD1. Again, the selective level-shifting performed by each of the digital circuit driving stages 202.3, 202.5 is in response to signals provided on the I/O interface 202.1 by the digital circuit 201, which again controls the direction of data flow in this manner.

Turning now to FIG. 2C, to do so the digital circuit driving stages 202.3, 202.5 each comprise an input stage that is coupled to the I/O interface 202.1, 202.2, respectively, as well as an output stage that is coupled (either directly or indirectly) to the I/O interface 202.2, 202.1, respectively. The respective input stage of each of the digital circuit driving stages 202.3, 202.5 is thus configured to receive signals provided on the respective I/O interfaces 202.1, 202.2, whereas the respective output stage of each of the digital circuit driving stages 202.3, 202.5 is configured to perform level-shifting of these received signals as discussed above. Thus, the respective input stage of each of the digital circuit driving stages 202.3, 202.5 may comprise any suitable hardware configured to generate one or more output signals that are fed to each respective output stage based upon the voltage level of the received signals. The respective input stage of each of the digital circuit driving stages 202.3, 202.5 is configured to generate these output signals to ensure that the respectively-coupled output stage in each case translates the logical voltage level of the received signal to the corresponding level-shifted voltage level as discussed above.

For example, the respective input stage of each of the digital circuit driving stages 202.3, 202.5 is shown in further detail in FIG. 2C, which are implemented as Schmitt triggers ST2, ST3, and ST4. The use of the Schmitt triggers as shown in FIG. 2C is provided by way of example and not limitation, and it is noted that the respective input stage of each of the digital circuit driving stages 202.3, 202.5 may comprise additional or alternative components to achieve the same purpose of providing output signals to each respective output stage as discussed herein. For example, the respective input stage of each of the digital circuit driving stages 202.3, 202.5 may be implemented as buffers, inverters, etc. Alternatively, other architectures may be realized other than those as shown in the Figures, and thus differential amplifiers may be implemented for this purpose as an alternative to the Schmitt triggers as shown.

As another example, the respective output stage of each of the digital circuit driving stages 202.3, 202.5 is also shown in further detail in FIG. 2C, which are implemented as a set of field-effect transistors (FETs) having complementary conductivity types (e.g. a p-channel and n-channel). However, the use of the FETs as shown in FIG. 2C is also provided by way of example and not limitation, and it is noted that the respective output stage of each of the digital circuit driving stages 202.3, 202.5 may comprise additional or alternative components to achieve the same purpose of providing level-shifted signals to each respective I/O interface 202.1, 202.2 as discussed herein. For example, the respective output stage of each of the digital circuit driving stages 202.3, 202.5 may be implemented as alternate transistor types, operational amplifiers, etc.

Turning first to the digital circuit driving stage 202.3, the example configuration as shown in further detail in FIG. 2C implements a pair of Schmitt triggers ST2, ST3 as the input stage. In an embodiment, the Schmitt triggers ST2, ST3 are configured to generate output signals having a logical low voltage level when respective threshold conditions are met, and to otherwise output a logical voltage level. It is noted that the level-shifting circuitry 202 may implement a die having the same operating range of logical voltage levels as the higher of the ranges implemented by the digital circuits 201, 203. Thus, in the present example, the output signals generated by the Schmitt triggers ST2, ST3 may comprise logical high and logical low voltage values corresponding to the second range of logical voltage levels VSS2-VDD2, which are assumed in this case to be the same as those implemented by the digital circuit 203 by way of example and not limitation.

The Schmitt trigger ST2 may have threshold trigger values that are centered about a predetermined voltage value that corresponds, for example, to the lower end of the intermediate range of voltage levels as shown in FIG. 3 (e.g. ⅙ of VDD1). Moreover, the Schmitt trigger ST3 may have threshold trigger values that are centered about a predetermined voltage value that corresponds, for example, to the upper end of the intermediate range of voltage levels as shown in FIG. 3 (e.g. ⅚ of VDD1). The threshold trigger values implemented by each of the Schmitt triggers ST2, ST3 in this manner may correspond to voltage values that are established about a midpoint voltage value in accordance with typical Schmitt trigger operation, as noted above for the Schmitt trigger ST1. Thus, each of the Schmitt triggers ST2, ST3 may respectively implement two threshold trigger values, with a difference between one another being, for instance, +2%, +5%, +10%, etc., about each respective predetermined (i.e. midpoint) voltage value (e.g. ⅙ of VDD1 for Schmitt trigger ST2 and ⅚ of VDD1 for Schmitt trigger ST3).

As a result, the Schmitt trigger ST2 is configured to generate a first output signal having a logical high voltage value in response to the voltage level of signals received via the I/O interface 202.1 being less than or equal to the lower voltage level of the intermediate range of voltage levels (e.g. ⅙ of VDD1). Additionally, the Schmitt trigger ST3 is configured to generate a second output signal having a logical low voltage value in response to the voltage level of signals received via the I/O interface 202.1 being less than or equal to the upper voltage level of the intermediate range of voltage levels (e.g. ⅚ of VDD1).

In an embodiment, the output stage of the digital circuit driving stage 202.3 comprises a pair of transistors having complementary conductivity types, with the gate of each transistor J1, J2 been coupled to a respective output of the Schmitt trigger ST2, ST3 as shown in FIG. 2C. The pair of transistors comprises an n-type FET J1 and a p-type FET J2. The n-type FET J1 conducts only when the output signal generated by the Schmitt trigger ST2 has a logical high value, which is when the voltage provided at the I/O interface 202.1 is less than or equal to ⅙ of VDD1, and otherwise does not conduct. The p-type FET J2 conducts only when the output voltage provided by the Schmitt trigger ST3 has a logical low value, which is when the voltage provided at the I/O interface 202.1 is greater than or equal to ⅚ of VDD1, and otherwise does not conduct. It is noted that the threshold trigger values and accompanying output signals generated by the input stage in this manner correspond to the range of voltages for the digital circuit 201 as shown in FIG. 3 that correspond to the digital circuit 201 operating in the transmit mode. In this way, the pair of complementary transistors J1, J2 function to selectively generate level-shifted signals that comply with the second range of logical voltage levels VSS2-VDD2 by way of changes in the conductive state of the transistors J1, J2 in response to the voltage level of the signals provided by the digital circuit 201 on the I/O interface 201.1.

Turning now to the digital circuit driving stage 202.5, the example configuration as shown in further detail in FIG. 2C implements a single Schmitt trigger ST4 as the input stage. In an embodiment, the Schmitt triggers ST4 is configured to generate an output signal having a logical low voltage level when threshold condition is met, and to otherwise output a logical high value. Similar to the input stage of the digital circuit driving stage 202.3, the output signal generated by the Schmitt trigger ST4 may comprise logical high and logical low voltage values corresponding to the second range of logical voltage levels VSS2-VDD2, which again are assumed in this case to be the same as those implemented by the digital circuit 203 by way of example and not limitation.

The Schmitt trigger ST4 may implement a pair of threshold trigger values that span a predetermined voltage value such as, for example, the midpoint of the second range of logical voltage levels VSS2-VDD2 as shown in FIG. 3 (e.g. ½ of VDD2). Thus, the Schmitt trigger ST4 may have a threshold trigger values that are centered about a predetermined voltage value that corresponds, for example, to the midpoint in the second range of logical voltage levels VSS2-VDD2 as shown in FIG. 3 (e.g. ½ of VDD2). The threshold trigger values implemented by the Schmitt trigger ST4 may thus correspond to the midpoint of this threshold trigger value in accordance with typical Schmitt trigger operation. Thus, the two threshold trigger values may have a difference between one another of, for instance, ±2%, ±5%, ±10%, etc., centered about the (midpoint) predetermined voltage, such as ½ of VDD2 in the present example.

As a result, the Schmitt trigger ST4 is configured to generate an output signal having a logical high voltage value in response to the voltage level of signals received via the I/O interface 202.2 being greater than or equal to the midpoint of the second range of logical voltage levels VSS2-VDD2 (e.g. ½ of VDD2). Additionally, the Schmitt trigger ST4 is configured to generate the output signal having a logical low voltage value in response to the voltage level of signals received via the I/O interface 202.2 being less than or equal to the midpoint of the second range of logical voltage levels VSS2-VDD2 (e.g. ½ of VDD2). If the received signals have a voltage level that lies between the two threshold trigger voltages, the output signal generated by the Schmitt trigger ST4 remains unchanged. Of course, and as noted herein, the use of Schmitt triggers and their respective threshold values are provided by way of example and not limitation, and the embodiments as described herein may implement any suitable alternate configurations to generate the output signal in response to the voltage level of signals received via the I/O interface 202.2.

In an embodiment, similar to the digital circuit driving stage 202.3, the output stage of the digital circuit driving stage 202.5 also comprises a pair of transistors J3, J4 having complementary conductivity types, with the gate of each transistor J3, J4 been coupled to the output of the Schmitt trigger ST4. The pair of transistors comprises an n-type FET J3 and a p-type FET J4. The n-type FET J3 conducts only when the output signal generated by the Schmitt trigger ST4 has a logical high value, which is when the voltage provided at the I/O interface 202.2 is less than or equal to ½ of VDD2, and otherwise does not conduct. The p-type FET J4 conducts only when the output voltage provided by the Schmitt trigger ST4 has a logical low value, which is when the voltage provided at the I/O interface 202.2 is greater than or equal to ½ VDD2, and otherwise does not conduct. It is noted that the threshold trigger values generated by the input stage in this manner correspond to the second range of voltages for the digital circuit 203 that correspond to the digital circuit 203 operating in the transmit mode.

In this way, the pair of complementary transistors J3, J4 function to selectively generate level-shifted signals that comply with the first range of logical voltage levels VSS1-VDD1 by way of changes in the conductive state of the transistors J3, J4 in response to the voltage level of the signals provided by the digital circuit 203 on the I/O interface 201.2. However, for the level-shifting performed by the output stage of the digital circuit driving stage 202.5, the transistors J3, J4 perform level shifting to comply with the first range of logical voltage levels VSS1-VDD1 by generating output signals having a voltage that is a proportion of VDD1. This ensures that the voltage level of the signals received by the digital circuit 201 remain within the intermediate range of voltage levels as shown in FIG. 3. For instance, the voltage levels of ⅓ VDD1 and ⅔ VDD1 are selected as these represent the midpoint between ½ of VDD and the lower and upper voltage levels of ⅙ VDD1 and ⅚ VDD1 as noted above. This also ensures that the digital circuit 201 detects the logical low and the logical high voltage levels within the first range of logical voltage levels VSS1-VDD1 in response to the voltage levels of ⅓ VDD1 and ⅔ VDD1, respectively.

To perform the selective generation of the level-shifted signals, the output stage of the digital circuit driving stage 202.5 also comprises a transistor J5 as shown in FIG. 2C. The transistor J5 is also shown as an n-type FET in FIG. 2C by way of example and not limitation, and the same functionality may be facilitated via additional or alternate components, such as different types of transistors, a solid state switch, etc. The gate of the transistor J5 is coupled to logic circuitry 202.4, whereas the other terminals of the transistor J5 are coupled to the output stage and the I/O interface 202.1 as shown in FIG. 2C. Thus, the conductive state of the transistor J5, which results in the selective coupling of the I/O interface 202.1 and the output stage, is controlled via a control signal output by the logic circuitry 202.4 (i.e. the output of NOR gate G2), which is coupled to the gate of the transistor J5. The operation of the logic circuitry 202.4 is further discussed below.

The logic circuitry 202.4 is configured to generate the control signal, which again controls a conductive state of the transistor J5, based upon a voltage level of the signals provided by the digital circuit 201. To do so, the logic circuitry 202.4 may comprise any suitable number and/or type of hardware components that are configured to generate a control signal that selectively places the transistor J5 into a conductive state when the digital circuit 201 is receiving and when the digital circuit 203 is transmitting, and otherwise places the transistor J5 into a non-conductive state. Thus, the logic circuitry 202.4 may have any suitable arrangement and type of logic elements, with those shown in FIG. 2C representing a non-limiting and illustrative example. Embodiments may include the logic circuitry 202.4 implementing a different combination of gates, different logic, etc., to achieve the same functionality.

With continued reference to FIG. 2C, the logic circuitry 202.4 comprises an inverter G1 and a NOR gate G2. The output of the inverter G1 is coupled to one input terminal of the NOR gate G2, and the input of the inverter G1 is coupled to the output of the Schmitt trigger ST3. Furthermore, the other input terminal of the NOR gate G2 is coupled to the output of the Schmitt trigger ST2. In this configuration, it is noted that the control signal output via the NOR gate G2 comprises a logical high value only when both inputs are logical low values. Accounting for the inverter G1, this means that the control signal output via the NOR gate G2 comprises a logical high value only when the output signal provided by the Schmitt trigger ST3 is a logical high voltage level and the output signal provided by the Schmitt trigger ST2 is a logical low voltage level.

As noted above, the output signals generated by the Schmitt triggers ST2, ST3 that correspond to these logical voltage values result in both of the transistors J1, J2 being placed in a non-conductive state. In this scenario, this is the result of the threshold conditions of the Schmitt triggers ST2, ST3 not being met, i.e. the voltage levels provided on the I/O interface being within the intermediate range of voltage levels as shown in FIG. 3. Again, this corresponds to the digital circuit 201 operating in a receiving mode while the digital circuit 203 operates in a transmitting mode. Thus, in this case the transistor J5 conducts, thereby enabling the digital circuit driving stage 202.5 to provide the level-shifted voltages output via the output stage onto the I/O interface 202.1.

Otherwise, when the voltage levels provided on the I/O interface 202.1 via the digital circuit 201 are within the intermediate range of voltage levels as shown in FIG. 3, the logic circuitry 202.4 generates the control signal having a logical low voltage value such that the transistor J5 does not conduct. Again, this is the case when the digital circuit 201 is transmitting and the digital circuit 203 is receiving. Thus, the logic circuitry 202.4 generates the control signal that controls the state of the digital circuit driving stage 202.5 based upon the voltage level of the signals provided by the digital circuit 201 onto the I/O interface 201.1. For example, the state of the digital circuit driving stage 202.5 may comprise a driving state in which voltage is applied to the I/O interface 202.1 (e.g. when the transistor 202.5 conducts). As another example, the state of the digital circuit driving stage 202.5 may comprise an open state (e.g. when the transistor 202.5 does not conduct) in which voltage is not applied to the I/O interface 202.1. In this way, the logic circuitry 202.4 is configured to generate the control signal to place the digital circuit driving stage 202.5 into the driving state only when the voltage level of signals provided by the digital circuit 201 are within the intermediate range of voltage levels. Doing so couples the level-shifted signals output via the output stage of the digital circuit driving stage 202.5 to the I/O interface 202.1.

In light of the foregoing, the overall operation of the bi-directional level shifting system 200 is now summarized for clarity. When the digital circuit 201 operates in the transmitting mode and the digital circuit 203 operates in the receiving mode, the digital circuit 201 drives the signal 'A' on the I/O interface 202.1 to voltage levels that are outside the intermediate range of voltage levels as shown in FIG. 3 (e.g. less than ⅙ of VDD1 for a logical low value or greater than ⅚ of VDD1 for a logical high value). In response, the level-shifting circuitry 202 drives (via the output stage of the digital circuit driving stage 202.3.3) the signal 'B' to a logical low value (e.g. VSS2) or a logical high value (e.g. VDD2), respectively.

However, upon entering into this mode of operation, the digital circuit 201 and the level-shifting circuitry 202 may temporarily drive against each other during a transient period in which the transistor J5 remains in a conductive state (e.g. from previous operation in the opposite direction).

To address this, embodiments include the level-shifting circuitry 202 comprising a current-limiting resistor R1, which may be of any suitable value to ensure that the level-shifting circuitry 202 cannot drive the I/O interface 202.1 with the same level of current as the digital circuit 201. It is noted that the resistor R1 is optional, as alternative techniques for current limiting may be implemented. For example, current limiting may be achieved by reducing the size of the transistors J3, J4, and/or J5 such that the level-shifting circuitry 202 is incapable of sourcing the same level of current as the digital circuit 201. In any event, the use of such current-limiting techniques ensure that during this transient period, the digital circuit 201 "wins," with the current flow stopping as soon as the voltage level on the I/O interface 202.1 is outside the intermediate range of voltage levels as shown in FIG. 3. Again, this is due to the logic circuitry 202.4 generating the control signal to place the transistor J5 into the non-conductive state.

The digital circuit 201 may then transition from operating in the transmitting mode to operating in the receiving mode. To do so, the digital circuit 201 temporarily drives signal 'A' (e.g. via the TX/RX mode select circuitry 201.2) to a voltage that is within the intermediate range of voltage levels as shown in FIG. 3, such as ½ of VDD1 for instance. During this transitioning time period, the digital circuit 201 and the level-shifting circuitry 202 drive against each other. However, the digital circuit 201 stops driving as soon as the voltage level on the I/O interface 201.1 reaches a voltage level that is inside the intermediate range of voltage levels as shown in FIG. 3 (e.g. greater than ⅙ of VDD1 or less than ⅚ of VDD1). Thus, current flow stops as soon as the digital circuit 201 enters into a high-impedance state upon this condition being met.

The digital circuit 201 then continues to operate in the receiving mode. To do so, the digital circuit 201 does not drive signal A on the I/O interface 201.1, but instead remains in a high impedance state while the digital circuit 203 drives the signal 'B' to logical high and logical low voltage levels within the second range of logical voltage levels VSS2-VDD2. For example, the digital circuit 203 may drive the signal B to a logical low value that is less than or equal to ½ of VDD2, and drive the signal B to a logical high value that is greater than or equal to ½ of VDD2.

In this mode of operation, the level-shifting circuitry 202 performs level shifting by driving the signal A on the I/O interface 202.1 to ⅓ or ⅔ of the first range of logical voltage levels VSS1-VDD1 for logical low and logical high values, respectively, that are received from the digital circuit 203 on the I/O interface 201.2. However, in this state the level-shifting circuitry 202 drives the I/O interface 202.1 with a limited current, as noted above.

The digital circuit 201 may then transition from operating in the receiving mode back to operating in the transmitting mode. To do so, the digital circuit 201 and the level-shifting circuitry 202 once again temporarily drive against each other. However, the digital circuit 201 "wins," because the level-shifting circuitry 202 is current limited while the digital circuit 201 is not. Once again, the current flow stops as soon as voltage on the I/O interface 201.1 is outside the intermediate range of voltage levels as shown in FIG. 3.

Advantageously, it is noted that because the present operating mode and direction is detected by the level-shifting circuitry 202 via encoded voltage levels, the level-shifting circuitry 202 requires no current flow when the digital circuit 201 is operating in either the transmitting or receiving mode. Although some current may temporarily be sourced by the level-shifting circuitry 202, this current is limited and is only provided during brief transient periods. Thus, the embodiments as described herein achieve lower power consumption compared to current-sensing solutions, as noted above.

EXAMPLES

The techniques of this disclosure may also be described in the following examples.

Example 1. A bi-directional level-shifter circuit, comprising: a first input/output (I/O) interface configured to be coupled to a first digital circuit that is configured to operate within a first range of logical voltage levels; a second I/O interface configured to be coupled to a second digital circuit that is configured to operate within a second range of logical voltage levels; and level-shifting circuitry coupled to the first I/O interface and to the second I/O interface, the level-shifting circuitry being configured to: level shift signals provided by the second digital circuit from the second range of logical voltage levels to comply with the first range of logical voltage levels when a voltage level of signals provided by the first digital circuit are within an intermediate range of voltage levels that are within and span a smaller range than the first range of logical voltage levels; and level shift signals provided by the first digital circuit from the first range of logical voltage levels to comply with the second range of logical voltage levels when a voltage level of signals provided by the first digital circuit are outside the intermediate range of voltage levels.

Example 2. The bi-directional level-shifter circuit of Example 1, wherein the level-shifting circuitry is configured to, based upon the voltage level of the signals provided by the first digital circuit, selectively switch between (i) the first I/O interface receiving signals from the first digital circuit and the second I/O interface transmitting level shifted signals to the second digital circuit, and (ii) the second I/O interface receiving signals from the second digital circuit and the first I/O interface transmitting level shifted signals to the first digital circuit.

Example 3. The bi-directional level-shifter circuit of any combination of Examples 1-2, wherein the first range of logical voltage levels are less than the second range of logical voltage levels.

Example 4. The bi-directional level-shifter circuit of any combination of Examples 1-3, wherein the intermediate range of voltage levels are within (i) an upper voltage level that is less than a logical high voltage level of the first range of logical voltage levels by an offset voltage that is a proportional to the logical high voltage level, and (ii) a lower voltage level that is greater than a logical low value of the first range of logical voltage level by the offset voltage.

Example 5. The bi-directional level-shifter circuit of any combination of Examples 1-4, wherein the level-shifting circuitry comprises a second digital circuit driving stage that is coupled to the second I/O interface, and wherein the second digital circuit driving stage is configured to selectively level-shift signals provided by the second digital circuit from the second range of logical voltage levels to comply with the first range of logical voltage levels.

Example 6. The bi-directional level-shifter circuit of any combination of Examples 1-5, wherein the level-shifting circuitry comprises logic circuitry that is coupled to the second digital circuit driving stage and is configured to generate a control signal that controls, based upon the voltage level of the signals provided by the first digital circuit, a state of the second digital circuit driving stage between (i) a driving state in which voltage is applied to the first I/O interface, and (ii) an open state in which voltage is not applied to the first I/O interface.

Example 7. The bi-directional level-shifter circuit of any combination of Examples 1-6, wherein the logic circuitry is configured to generate the control signal to place the second digital circuit driving stage into the driving state when the voltage level of signals provided by the first digital circuit are within the intermediate range of voltage levels to thereby couple level-shifted signals to the first I/O interface.

Example 8. The bi-directional level-shifter circuit of any combination of Examples 1-7, wherein the level-shifting circuitry comprises a first digital circuit driving stage that is coupled to the first I/O interface, and wherein the first digital circuit driving stage is configured to, in response to signals provided by the first digital circuit, selectively level-shift signals provided by the first digital circuit from the first range of logical voltage levels to comply with the second range of logical voltage levels.

Example 9. The bi-directional level-shifter circuit of any combination of Examples 1-8, wherein the first digital circuit driving stage comprises an input stage and an output stage, the input stage being coupled to the first I/O interface, and the output stage being coupled to the second I/O interface.

Example 10. The bi-directional level-shifter circuit of any combination of Examples 1-9, wherein the input stage is configured to: generate a first output signal having a first predetermined voltage level that is provided to the output stage in response to the voltage level of signals received via the first I/O interface being greater than or equal to an upper voltage level of the intermediate range of voltage levels, and generate a second output signal having a second predetermined voltage level that is provided to the output stage when the voltage level of signals received via the first I/O interface is less than or equal to a lower voltage level of the intermediate range of voltage levels.

Example 11. The bi-directional level-shifter circuit of any combination of Examples 1-10, wherein: the level-shifting circuitry comprises a pair of transistors, a gate of each one of the pair of transistors is coupled to the second I/O interface via an input stage that is configured to receive signals transmitted by the second digital circuit, and the pair of transistors are configured to generate level-shifted signals in response to the signals transmitted by the second digital circuit, the level-shifted signals complying with the first range of logical voltage levels.

Example 12. The bi-directional level-shifter circuit of any combination of Examples 1-11, wherein the level-shifting circuitry comprises: a further transistor coupled to the pair of transistors and to the first I/O interface; and logic circuitry coupled to the further transistor and configured to generate a control signal that controls, based upon a voltage level of the signals provided by the first digital circuit, a conductive state of the further transistor.

Example 13. The bi-directional level-shifter circuit of any combination of Examples 1-12, wherein the logic circuitry is configured to generate the control signal to place the further transistor into a conductive state when the voltage level of signals provided by the first digital circuit are within the intermediate range of voltage levels, to thereby couple level-shifted signals to the first I/O interface.

Example 14. The bi-directional level-shifter circuit of any combination of Examples 1-13, wherein the level-shifting circuitry comprises a pair of transistors configured to generate level-shifted signals in response to the signals provided by the first digital circuit, the level-shifted signals complying with the second range of logical voltage levels.

Example 15. A bi-directional level-shifter circuit, comprising: a first input/output (I/O) interface configured to be coupled to a first digital circuit that is configured to operate within a first range of logical voltage levels; a second I/O interface configured to be coupled to a second digital circuit that is configured to operate within a second range of logical voltage levels; and level-shifting circuitry coupled to the first I/O interface and to the second I/O interface, the level-shifting circuitry being configured to, based upon a voltage level of signals provided by the first digital circuit being within an intermediate range of voltage levels that are within and span a smaller range than the first range of logical voltage levels, selectively switch between operating in (i) a first mode in which the first I/O interface receives signals and the second I/O interface transmit signals, and (ii) a second mode in which the first I/O interface transmit signals and the second I/O interface receives signals.

Example 16. The bi-directional level-shifter circuit of Example 15, wherein the level-shifting circuitry is configured to operate in the first mode when the voltage level of signals provided by the first digital circuit are within the intermediate range of voltage levels, and to operate in the second mode when the voltage level of signals provided by the first digital circuit are outside the intermediate range of voltage levels.

Example 17. The bi-directional level-shifter circuit of any combination of Examples 15-16, wherein the level-shifting circuitry is configured to: when operating in the first mode, to level shift signals provided by the second digital circuit from the second range of logical voltage levels to comply with the first range of logical voltage levels; and when operating in the second mode, to level shift signals provided by the first digital circuit from the first range of logical voltage levels to comply with the second range of logical voltage levels.

Example 18. The bi-directional level-shifter circuit of any combination of Examples 15-17, wherein the first range of logical voltage levels are less than the second range of logical voltage levels.

Example 19. The bi-directional level-shifter circuit of any combination of Examples 15-18, wherein the intermediate range of voltage levels are within (i) an upper voltage level that is less than a logical high voltage level of the first range of logical voltage levels by an offset voltage that is a proportional to the logical high voltage level, and (ii) a lower voltage level that is greater than a logical low value of the first range of logical voltage level by the offset voltage.

Example 20. The bi-directional level-shifter circuit of any combination of Examples 15-19, wherein the level-shifting circuitry comprises a second digital circuit driving stage coupled to the second I/O interface, and wherein the second digital circuit driving stage is configured to selectively level-shift signals provided by the second digital circuit from the second range of logical voltage levels to comply with the first range of logical voltage levels.

Example 21. The bi-directional level-shifter circuit of any combination of Examples 15-20, wherein the level-shifting circuitry comprises logic circuitry that is coupled to the second digital circuit driving stage and configured to generate a control signal that controls, based upon the voltage level of the signals provided by the first digital circuit, a state of the second digital circuit driving stage between (i) a driving state in which voltage is applied to the first I/O interface, and (ii) an open state in which voltage is not applied to the first I/O interface.

Example 22. The bi-directional level-shifter circuit of any combination of Examples 15-21, wherein the logic circuitry is configured to generate the control signal to place the second digital circuit driving stage into the driving state when the voltage level of signals provided by the first digital circuit are within the intermediate range of voltage levels to thereby couple the level-shifted signals to the first I/O interface.

Example 23. The bi-directional level-shifter circuit of any combination of Examples 15-22, wherein the level-shifting circuitry comprises a first digital circuit driving stage comprising an input stage and an output stage, the input stage being coupled to the first I/O interface, and the output stage being coupled to the second I/O interface, and wherein the first digital circuit driving stage is configured, in response to signals provided by the first digital circuit, to selectively level-shift signals provided by the first digital circuit from the first range of logical voltage levels to comply with the second range of logical voltage levels.

Example 24. The bi-directional level-shifter circuit of any combination of Examples 15-23, wherein the input stage is configured to: generate a first output signal having a first predetermined voltage level that is provided to the output stage in response to the voltage level of signals received via the first I/O interface being greater than or equal to an upper voltage level of the intermediate range of voltage levels, and generate a second output signal having a second predetermined voltage level that is provided to the output stage when the voltage level of signals received via the first I/O interface is less than or equal to a lower voltage level of the intermediate range of voltage levels.

Example 25. The bi-directional level-shifter circuit of any combination of Examples 15-24, wherein: the level-shifting circuitry comprises a pair of transistors, a gate of each one of the pair of transistors is coupled to the second I/O interface via an input stage that is configured to receive signals transmitted by the second digital circuit, and the pair of transistors are configured to generate level-shifted signals in response to the signals transmitted by the second digital circuit, the level-shifted signals complying with the first range of logical voltage levels.

Example 26. The bi-directional level-shifter circuit of any combination of Examples 15-25, wherein the level-shifting circuitry comprises: a further transistor coupled to the pair of transistors and to the first I/O interface; and logic circuitry coupled to the further transistor and configured to generate a control signal that controls, based upon a voltage level of the signals provided by the first digital circuit, a conductive state of the further transistor.

Example 27. The bi-directional level-shifter circuit of any combination of Examples 15-26, wherein the logic circuitry is configured to generate the control signal to place the further transistor into a conductive state when the voltage level of signals provided by the first digital circuit are within the intermediate range of voltage levels, to thereby couple level-shifted signals to the first I/O interface.

Example 28. The bi-directional level-shifter circuit of any combination of Examples 15-27, wherein the level-shifting circuitry comprises a pair of transistors configured to generate level-shifted signals in response to the signals provided by the first digital circuit, the level-shifted signals complying with the second range of logical voltage levels.

Example 29. A system, comprising: a microcontroller configured to selectively operate in a transmitting mode or a receiving mode within a first range of logical voltage levels; and a bi-directional level-shifter circuit, comprising: a first interface coupled to the microcontroller; a second interface coupled to a digital circuit that is configured to operate within a second range of logical voltage levels; and level-shifting circuitry that is coupled to the first interface and to the second interface, the level-shifting circuitry being configured to: level shift signals provided by the digital circuit from the second range of logical voltage levels to comply with the first range of logical voltage levels when a voltage level of signals provided by the microcontroller are within an intermediate range of voltage levels that are within and span a smaller range than the first range of logical voltage levels; and level shift signals provided by the microcontroller from the first range of logical voltage levels to comply with the second range of logical voltage levels when a voltage level of signals provided by the microcontroller are outside the intermediate range of voltage levels.

Example 30. The system of Example 29, wherein the level-shifting circuitry is configured to, based upon the voltage level of the signals provided by the microcontroller, selectively switch between (i) the first interface receiving signals from the microcontroller and the second interface transmitting the level shifted signals to the digital circuit, and (ii) the second interface receiving signals from the digital circuit and the first interface transmitting the level shifted signals to the microcontroller.

A method as shown and described.

An apparatus as shown and described.

CONCLUSION

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation data. The term "information" may in addition to any form of digital information also include other forms of representing information. The term "entity" or "unit" may in embodiments include any device, apparatus circuits, hardware, software, firmware, chips, or other semiconductors as well as logical units or physical implementations of protocol layers etc. Furthermore, the terms "coupled" or "connected" may be interpreted in a broad sense not only covering direct but also indirect coupling.

It is further to be noted that methods disclosed in the specification or in the claims may be implemented by a device having means for performing each of the respective steps of these methods.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A bi-directional level-shifter circuit, comprising:

a first input/output (I/O) interface configured to be coupled to a first digital circuit that is configured to operate within a first range of logical voltage levels;

a second I/O interface configured to be coupled to a second digital circuit that is configured to operate within a second range of logical voltage levels; and level-shifting circuitry coupled to the first I/O interface and to the second I/O interface, the level-shifting circuitry being configured to:

level shift signals provided by the second digital circuit from the second range of logical voltage levels to comply with the first range of logical voltage levels when a voltage level of signals provided by the first digital circuit is within an intermediate range of voltage levels that is within and spans a smaller range than the first range of logical voltage levels; and level shift the signals provided by the first digital circuit from the first range of logical voltage levels to comply with the second range of logical voltage levels when the voltage level of the signals provided by the first digital circuit is outside the intermediate range of voltage levels.

2. The bi-directional level-shifter circuit of claim 1, wherein the level-shifting circuitry is configured to, based upon the voltage level of the signals provided by the first digital circuit, selectively switch between (i) the first I/O interface receiving the signals provided by the first digital circuit and the second I/O interface transmitting level shifted signals to the second digital circuit, and (ii) the second I/O interface receiving the signals provided by the second digital circuit and the first I/O interface transmitting level shifted signals to the first digital circuit.

3. The bi-directional level-shifter circuit of claim 1, wherein the first range of logical voltage levels is less than the second range of logical voltage levels.

4. The bi-directional level-shifter circuit of claim 1, wherein the intermediate range of voltage levels is within (i) an upper voltage level that is less than a logical high voltage level of the first range of logical voltage levels by an offset voltage that is proportional to the logical high voltage level, and (ii) a lower voltage level that is greater than a logical low value of the first range of logical voltage levels by the offset voltage.

5. The bi-directional level-shifter circuit of claim 1, wherein the level-shifting circuitry comprises a second digital circuit driving stage that is coupled to the second I/O interface, and wherein the second digital circuit driving stage is configured to selectively level-shift the signals provided by the second digital circuit from the second range of logical voltage levels to comply with the first range of logical voltage levels.

6. The bi-directional level-shifter circuit of claim 5, wherein the level-shifting circuitry comprises logic circuitry that is coupled to the second digital circuit driving stage and is configured to generate a control signal that controls, based upon the voltage level of the signals provided by the first digital circuit, a state of the second digital circuit driving stage between (i) a driving state in which voltage is applied to the first I/O interface, and (ii) an open state in which voltage is not applied to the first I/O interface.

7. The bi-directional level-shifter circuit of claim 6, wherein the logic circuitry is configured to generate the control signal to place the second digital circuit driving stage into the driving state when the voltage level of the signals provided by the first digital circuit is within the intermediate range of voltage levels to thereby couple level-shifted signals to the first I/O interface.

8. The bi-directional level-shifter circuit of claim 1, wherein the level-shifting circuitry comprises a first digital circuit driving stage that is coupled to the first I/O interface, and wherein the first digital circuit driving stage is configured to, in response to the signals provided by the first digital circuit, selectively level-shift the signals provided by the first digital circuit from the first range of logical voltage levels to comply with the second range of logical voltage levels.

9. The bi-directional level-shifter circuit of claim 8, wherein the first digital circuit driving stage comprises an input stage and an output stage, the input stage being coupled to the first I/O interface, and the output stage being coupled to the second I/O interface.

10. The bi-directional level-shifter circuit of claim 9, wherein the input stage is configured to:

generate a first output signal having a first predetermined voltage level that is provided to the output stage in response to the voltage level of signals received via the first I/O interface being greater than or equal to an upper voltage level of the intermediate range of voltage levels, and generate a second output signal having a second predetermined voltage level that is provided to the output stage when the voltage level of signals received via the first I/O interface is less than or equal to a lower voltage level of the intermediate range of voltage levels.

11. The bi-directional level-shifter circuit of claim 1, wherein:

the level-shifting circuitry comprises a pair of transistors, a gate of each one of the pair of transistors is coupled to the second I/O interface via an input stage that is configured to receive the signals transmitted by the second digital circuit, and the pair of transistors are configured to generate level-shifted signals in response to the signals transmitted by the second digital circuit, the level-shifted signals complying with the first range of logical voltage levels.

12. The bi-directional level-shifter circuit of claim 11, wherein the level-shifting circuitry comprises:

a further transistor coupled to the pair of transistors and to the first I/O interface; and logic circuitry coupled to the further transistor and configured to generate a control signal that controls, based upon the voltage level of the signals provided by the first digital circuit, a conductive state of the further transistor.

13. The bi-directional level-shifter circuit of claim 12, wherein the logic circuitry is configured to generate the control signal to place the further transistor into a conductive state when the voltage level of the signals provided by the first digital circuit is within the intermediate range of voltage levels, to thereby couple level-shifted signals to the first I/O interface.

14. The bi-directional level-shifter circuit of claim 1, wherein the level-shifting circuitry comprises a pair of transistors configured to generate level-shifted signals in response to the signals provided by the first digital circuit, the level-shifted signals complying with the second range of logical voltage levels.

15. A bi-directional level-shifter circuit, comprising:

a first input/output (I/O) interface configured to be coupled to a first digital circuit that is configured to operate within a first range of logical voltage levels;

a second I/O interface configured to be coupled to a second digital circuit that is configured to operate within a second range of logical voltage levels; and level-shifting circuitry coupled to the first I/O interface and to the second I/O interface, the level-shifting circuitry being configured to, based upon a voltage level of signals provided by the first digital circuit being within an intermediate range of voltage levels that is within and spans a smaller range than the first range of logical voltage levels, selectively switch between operating in (i) a first mode in which the first I/O interface operates as a signal receiver and the second I/O interface signals operates as a signal transmitter, and (ii) a second mode in which the first I/O interface operates as a further signal transmitter and the second I/O interface operates as a further signal receiver.

16. The bi-directional level-shifter circuit of claim 15, wherein the level-shifting circuitry is configured to operate in the first mode when the voltage level of the signals provided by the first digital circuit is within the intermediate range of voltage levels, and to operate in the second mode when the voltage level of the signals provided by the first digital circuit is outside the intermediate range of voltage levels.

17. The bi-directional level-shifter circuit of claim 15, wherein the level-shifting circuitry is configured to:

when operating in the first mode, to level shift the signals provided by the second digital circuit from the second range of logical voltage levels to comply with the first range of logical voltage levels; and when operating in the second mode, to level shift the signals provided by the first digital circuit from the first range of logical voltage levels to comply with the second range of logical voltage levels.

18. The bi-directional level-shifter circuit of claim 15, wherein the first range of logical voltage levels is less than the second range of logical voltage levels.

19. The bi-directional level-shifter circuit of claim 15, wherein the intermediate range of voltage levels are is within (i) an upper voltage level that is less than a logical high voltage level of the first range of logical voltage levels by an offset voltage that is proportional to the logical high voltage level, and (ii) a lower voltage level that is greater than a logical low value of the first range of logical voltage levels by the offset voltage.

20. The bi-directional level-shifter circuit of claim 15, wherein the level-shifting circuitry comprises a second digital circuit driving stage coupled to the second I/O interface, and wherein the second digital circuit driving stage is config-ured to selectively level-shift the signals provided by the second digital circuit from the second range of logical voltage levels to comply with the first range of logical voltage levels.

21. The bi-directional level-shifter circuit of claim 20, wherein the level-shifting circuitry comprises logic circuitry that is coupled to the second digital circuit driving stage and configured to generate a control signal that controls, based upon the voltage level of the signals provided by the first digital circuit, a state of the second digital circuit driving stage between (i) a driving state in which voltage is applied to the first I/O interface, and (ii) an open state in which voltage is not applied to the first I/O interface.

22. The bi-directional level-shifter circuit of claim 21, wherein the logic circuitry is configured to generate the control signal to place the second digital circuit driving stage into the driving state when the voltage level of the signals provided by the first digital circuit is within the intermediate range of voltage levels to thereby couple the level-shifted signals to the first I/O interface.

23. The bi-directional level-shifter circuit of claim 15, wherein the level-shifting circuitry comprises a first digital circuit driving stage comprising an input stage and an output stage, the input stage being coupled to the first I/O interface, and the output stage being coupled to the second I/O interface, and wherein the first digital circuit driving stage is configured, in response to the signals provided by the first digital circuit, to selectively level-shift the signals provided by the first digital circuit from the first range of logical voltage levels to comply with the second range of logical voltage levels.

24. The bi-directional level-shifter circuit of claim 23, wherein the input stage is configured to:

generate a first output signal having a first predetermined voltage level that is provided to the output stage in response to the voltage level of signals received via the first I/O interface being greater than or equal to an upper voltage level of the intermediate range of voltage levels, and generate a second output signal having a second prede-termined voltage level that is provided to the output stage when the voltage level of signals received via the first I/O interface is less than or equal to a lower voltage level of the intermediate range of voltage levels.

25. The bi-directional level-shifter circuit of claim 15, wherein:

the level-shifting circuitry comprises a pair of transistors, a gate of each one of the pair of transistors is coupled to the second I/O interface via an input stage that is configured to receive signals transmitted by the second digital circuit, and the pair of transistors are configured to generate level-shifted signals in response to the signals transmitted by the second digital circuit, the level-shifted signals com-plying with the first range of logical voltage levels.

26. The bi-directional level-shifter circuit of claim 25, wherein the level-shifting circuitry comprises:

a further transistor coupled to the pair of transistors and to the first I/O interface; and logic circuitry coupled to the further transistor and con-figured to generate a control signal that controls, based upon the voltage level of the signals provided by the first digital circuit, a conductive state of the further transistor.

27. The bi-directional level-shifter circuit of claim 26, wherein the logic circuitry is configured to generate the control signal to place the further transistor into a conductive state when the voltage level of the signals provided by the first digital circuit is within the intermediate range of voltage levels, to thereby couple level-shifted signals to the first I/O interface.

28. The bi-directional level-shifter circuit of claim 15, wherein the level-shifting circuitry comprises a pair of transistors configured to generate level-shifted signals in response to the signals provided by the first digital circuit, the level-shifted signals complying with the second range of logical voltage levels.

29. A system, comprising:

a microcontroller configured to selectively operate in a transmitting mode or a receiving mode within a first range of logical voltage levels; and a bi-directional level-shifter circuit, comprising:

a first interface coupled to the microcontroller;

a second interface coupled to a digital circuit that is configured to operate within a second range of logical voltage levels; and level-shifting circuitry that is coupled to the first interface and to the second interface, the level-shifting circuitry being configured to:

level shift signals provided by the digital circuit from the second range of logical voltage levels to comply with the first range of logical voltage levels when a voltage level of signals provided by the microcontroller is within an intermediate range of voltage levels that is within and spans a smaller range than the first range of logical voltage levels; and level shift the signals provided by the microcontroller from the first range of logical voltage levels to comply with the second range of logical voltage levels when the voltage level of the signals provided by the microcontroller is outside the intermediate range of voltage levels.

30. The system of claim 29, wherein the level-shifting circuitry is configured to, based upon the voltage level of the signals provided by the microcontroller, selectively switch between (i) the first interface receiving the signals provided by the microcontroller and the second interface transmitting the level shifted signals to the digital circuit, and (ii) the second interface receiving the signals provided by the digital circuit and the first interface transmitting the level shifted signals to the microcontroller.

\* \* \* \* \*